(12) United States Patent
Huang et al.

(10) Patent No.: US 8,956,974 B2
(45) Date of Patent: Feb. 17, 2015

(54) DEVICES, SYSTEMS, AND METHODS RELATED TO PLANARIZING SEMICONDUCTOR DEVICES AFTER FORMING OPENINGS

(75) Inventors: Wayne H. Huang, Boise, ID (US); Anurag Jindal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 228 days.

(21) Appl. No.: 13/538,272

(22) Filed: Jun. 29, 2012

(65) Prior Publication Data
US 2014/0004698 A1 Jan. 2, 2014

(51) Int. Cl.
*H01L 21/44* (2006.01)
*H01L 21/768* (2006.01)

(52) U.S. Cl.
CPC .................. *H01L 21/76883* (2013.01)
USPC ............... 438/667; 438/675; 257/E21.582; 257/E21.597

(58) Field of Classification Search
CPC .................. H01L 21/76829; H01L 21/76831; H01L 21/76883
USPC .......... 438/633, 634, 667, 675; 257/E21.582, 257/E21.597
See application file for complete search history.

(56) References Cited

U.S. PATENT DOCUMENTS

| | | | |
|---|---|---|---|
| 7,605,082 B1 | 10/2009 | Reid et al. | |
| 7,968,460 B2 * | 6/2011 | Kirby et al. | 438/667 |
| 8,405,222 B2 * | 3/2013 | Yu et al. | 257/774 |
| 2003/0073386 A1 | 4/2003 | Ma et al. | |
| 2003/0113996 A1 * | 6/2003 | Nogami et al. | 438/638 |
| 2004/0188260 A1 * | 9/2004 | Bonkabeta et al. | 205/102 |
| 2005/0082676 A1 | 4/2005 | Andry et al. | |
| 2005/0145894 A1 * | 7/2005 | Chau et al. | 257/288 |
| 2005/0189319 A1 | 9/2005 | Guthrie et al. | |
| 2009/0215269 A1 * | 8/2009 | Boggs et al. | 438/693 |
| 2009/0315154 A1 * | 12/2009 | Kirby et al. | 257/621 |
| 2009/0321796 A1 * | 12/2009 | Inohara | 257/288 |
| 2010/0087060 A1 * | 4/2010 | Yin et al. | 438/648 |
| 2010/0255681 A1 * | 10/2010 | Chang et al. | 438/692 |
| 2011/0130077 A1 * | 6/2011 | Litke et al. | 451/41 |
| 2011/0198721 A1 | 8/2011 | Yang et al. | |
| 2011/0237161 A1 * | 9/2011 | Kiesel et al. | 451/5 |
| 2011/0275168 A1 | 11/2011 | Davis et al. | |
| 2011/0300710 A1 | 12/2011 | Henry et al. | |
| 2011/0316166 A1 * | 12/2011 | Yu et al. | 257/774 |
| 2011/0316168 A1 * | 12/2011 | Moon et al. | 257/774 |
| 2012/0043666 A1 * | 2/2012 | Park et al. | 257/774 |
| 2012/0083188 A1 * | 4/2012 | Kroell et al. | 451/28 |
| 2012/0227331 A1 * | 9/2012 | Yoshida et al. | 51/298 |

(Continued)

*Primary Examiner* — Joseph C Nicely
(74) *Attorney, Agent, or Firm* — Perkins Coie LLP

(57) ABSTRACT

Methods for making semiconductor devices are disclosed herein. A method configured in accordance with a particular embodiment includes forming a stop layer and a dielectric liner including dielectric material along sidewalls of openings, e.g., through-substrate openings, of the semiconductor device and excess dielectric material outside the openings. The method further includes forming a metal layer including metal plugs within the openings and excess metal. The excess metal and the excess dielectric material are simultaneously chemically-mechanically removed using a slurry including ceria and ammonium persulfate. The slurry is selected to cause selectivity for removing the excess dielectric material relative to the stop layer greater than about 5:1 as well as selectivity for removing the excess dielectric material relative to the excess metal from about 0.5:1 to about 1.5:1.

27 Claims, 9 Drawing Sheets

(56) References Cited

U.S. PATENT DOCUMENTS

| | | | |
|---|---|---|---|
| 2012/0267786 A1* | 10/2012 | Kirby et al. | 257/770 |
| 2012/0322260 A1* | 12/2012 | Tsai et al. | 438/667 |
| 2013/0000214 A1* | 1/2013 | Chu et al. | 51/308 |
| 2013/0011938 A1* | 1/2013 | Tsao et al. | 438/8 |
| 2013/0029489 A1* | 1/2013 | Suzuki | 438/693 |
| 2013/0143410 A1* | 6/2013 | Chen et al. | 438/699 |
| 2013/0178065 A1* | 7/2013 | Shi et al. | 438/693 |
| 2013/0244421 A1* | 9/2013 | Lin et al. | 438/653 |
| 2013/0248811 A1* | 9/2013 | Ren | 257/4 |
| 2013/0270711 A1* | 10/2013 | Hebding et al. | 257/774 |
| 2013/0288478 A1* | 10/2013 | Kim et al. | 438/693 |

* cited by examiner

US 8,956,974 B2

DEVICES, SYSTEMS, AND METHODS RELATED TO PLANARIZING SEMICONDUCTOR DEVICES AFTER FORMING OPENINGS

TECHNICAL FIELD

The present technology is related to planarizing semiconductor devices to remove material from surfaces of the semiconductor devices. In particular, some embodiments of the present technology are related to planarizing semiconductor devices after forming openings.

BACKGROUND

Forming semiconductor devices typically includes subjecting a semiconductor substrate or assembly to a series of processing steps, each directed to adding, removing, and/or altering material. Cumulatively, these processing steps can form electrical components, e.g., transistors, capacitors, and diodes, precisely and at very high densities. Networks of electrical connections between the electrical components can be complex and, in modern semiconductor devices, typically extend over multiple layers. Connections from one layer to another layer can be formed in openings, which can be selectively etched in desired patterns. Openings can also be used to form electrical connections extending to bond pads or other contacts between semiconductor devices and associated packaging components. Openings typically are lined with a dielectric material, e.g., silicon dioxide, to electrically isolate metal within the openings from nearby structures. Depositing dielectric liners exclusively in openings can be technically challenging, so dielectric liners are generally formed by depositing a blanket or continuous dielectric layer and performing an etch-back process.

Conventionally, after a continuous dielectric layer is deposited, the dielectric material around the openings is removed using chemical-mechanical planarization with a suitable slurry. Conventional planarization processes with sufficient precision to remove a continuous dielectric layer without damaging underlying structures typically remove dielectric materials and metals at significantly different rates. This can lead to undesirable topography when dielectric materials and metals are planarized simultaneously. To avoid this, the wafer is typically planarized before filling the openings with metal. After planarization, a wet cleans process, e.g., a piranha etch, can be used to remove residual slurry in the openings. This conventional approach, however, can have certain disadvantages, at least some of which have heretofore been unrecognized or inadequately addressed. Accordingly, there is a need for innovation in this area and in related areas of semiconductor device manufacturing.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1:
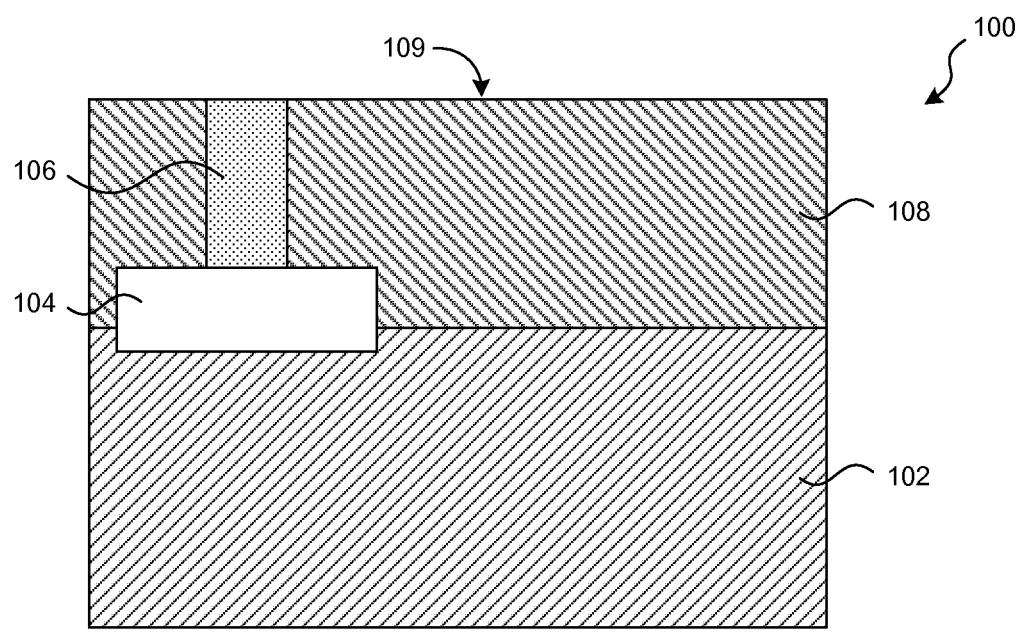
FIGS. 1-15 are partially schematic cross-sectional views illustrating a semiconductor device at selected steps in a method for making conductive structures in accordance with an embodiment of the present technology.

Specific details of several embodiments of methods for making semiconductor devices are described herein along with related methods, devices, and systems. The term "semiconductor device" generally refers to a solid-state device that includes semiconductor material. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person having ordinary skill in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

Many embodiments of the present technology are described below in the context of through-substrate vias (e.g., through-silicon vias), such as electrically conductive plugs or connectors that extend completely through the substrate when completed. A person having ordinary skill in the relevant art will also understand that the present technology may have additional embodiments, such as embodiments including other electrical connectors in a wafer, and that the present technology may be practiced without several of the details of the embodiments described herein with reference to FIGS. 1-17. For ease of reference, throughout this disclosure identical reference numbers are used to identify similar or analogous components or features, but the use of the same reference number does not imply that the parts should be construed to be identical. Indeed, in many examples described herein, the identically-numbered parts are distinct in structure and/or function. Furthermore, the same shading may be used to indicate materials in cross section that can be compositionally similar, but the use of the same shading does not imply that the materials should be construed to be identical.

Planarizing semiconductor devices to remove excess portions of a blanket or continuous dielectric layer around unfilled openings can be disadvantageous. For example, it can be difficult to completely remove residual slurry particles from the unfilled openings before forming metal plugs in the openings. As discussed above, wet cleans, e.g., piranha etching, can be used to remove most residual slurry particles in unfilled openings. Wet cleans, however, can be inadequate for completely removing residual slurry particles, particularly towards the bottoms of relatively small, high aspect-ratio openings, because such structures can be difficult to access. Slurry particles that remain in the openings can contaminate the metal plugs and cause at least partial failure of the device. Even when portions of the metal plugs, e.g., portions in the bottoms of the openings, are intended to be removed by backgrinding, contamination of these portions with slurry particles can still be problematic. For example, semiconductor devices are commonly tested before backgrinding, and contamination of portions of metal plugs intended to be removed by backgrinding can adversely affect this testing causing die to be scrapped prematurely or undesirably binned. Reducing this occurrence can enhance yields.

Methods in accordance with embodiments of the present technology can include removing, e.g., chemically-mechanically removing, excess dielectric material from areas around openings after filling the openings with conductive material rather than before. For example, a separate removal step directed to removing the excess dielectric material can be eliminated, thereby eliminating the possibility of contaminating the conductive material with residual slurry particles. Furthermore, eliminating the separate removal step can reduce the cost, complexity, duration, and/or other complications of an overall manufacturing process. For example, when used, a separate removal step may increase undesirable moisture absorption that can interfere with the deposition of barrier materials. Eliminating the separate removal step can reduce or eliminate the need for a bake-out step to remove such absorbed moisture and/or manufacturing controls to limit the time between the separate removal step and depositing the barrier material. Furthermore, eliminating the separate removal step can eliminate the need for wet cleans to remove residual slurry particles from unfilled openings, which can reduce or eliminate the possibility of the wet cleans damaging structures present on the substrate.

FIGS. 1-15 are partially schematic cross-sectional views illustrating a portion of a semiconductor device 100 in a method for making through-substrate vias or other connectors in accordance with an embodiment of the present technology. As shown in FIG. 1, the semiconductor device 100 can include a substrate 102, an electrical component 104 (shown schematically), and an electrode 106 extending from the electrical component 104 through a first dielectric 108. The electrical component 104 can be a transistor (e.g., a bipolar or field-effect transistor), a diode, a capacitor, or another suitable solid-state component formed in and/or on the substrate 102. In some embodiments, the electrode 106 can be a gate electrode and the semiconductor device 100 can further include a source electrode (not shown) and a drain electrode (not shown). Suitable materials for the electrode 106 include tungsten, among others.

Figure 2:
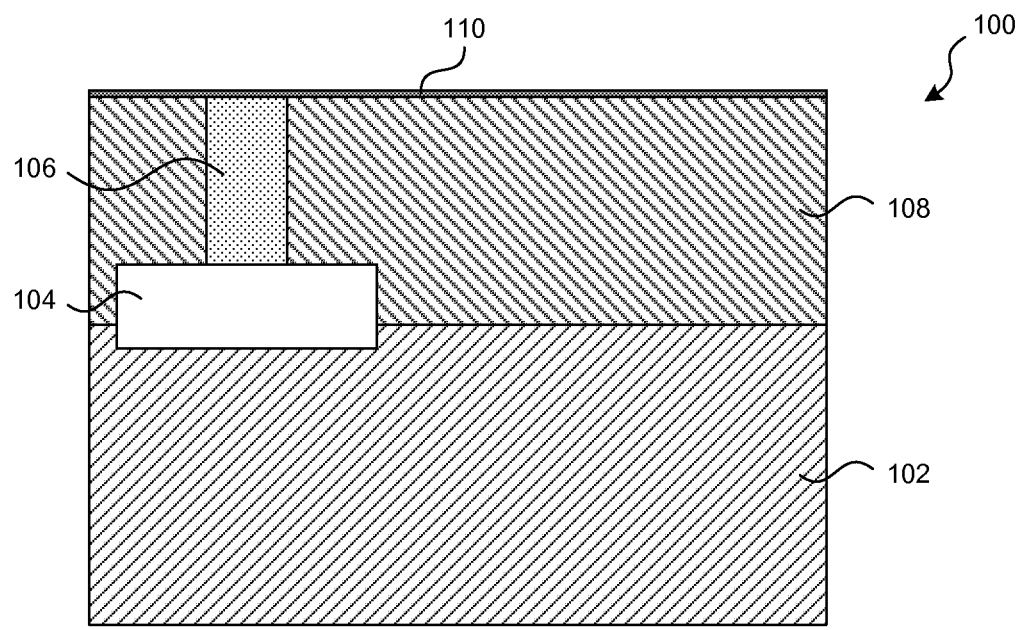

As shown in FIG. 1, the semiconductor device 100 can have a generally planar upper surface 109, e.g., resulting from a prior planarization process. FIG. 2 shows the semiconductor device 100 after a stop layer 110 has been formed on the upper surface 109. The stop layer 110 can define a second dielectric layer. In some embodiments, the stop layer 110 can include a low-k dielectric material, e.g., a dielectric material having a lower dielectric constant than silicon dioxide. Furthermore, the stop layer 110 can be selected to enhance control over planarization, as discussed in greater detail below with reference to FIGS. 11-12. In some embodiments, the stop layer 110 can include silicon nitride, e.g., carbon-doped silicon nitride, or another suitable material.

Figure 3:
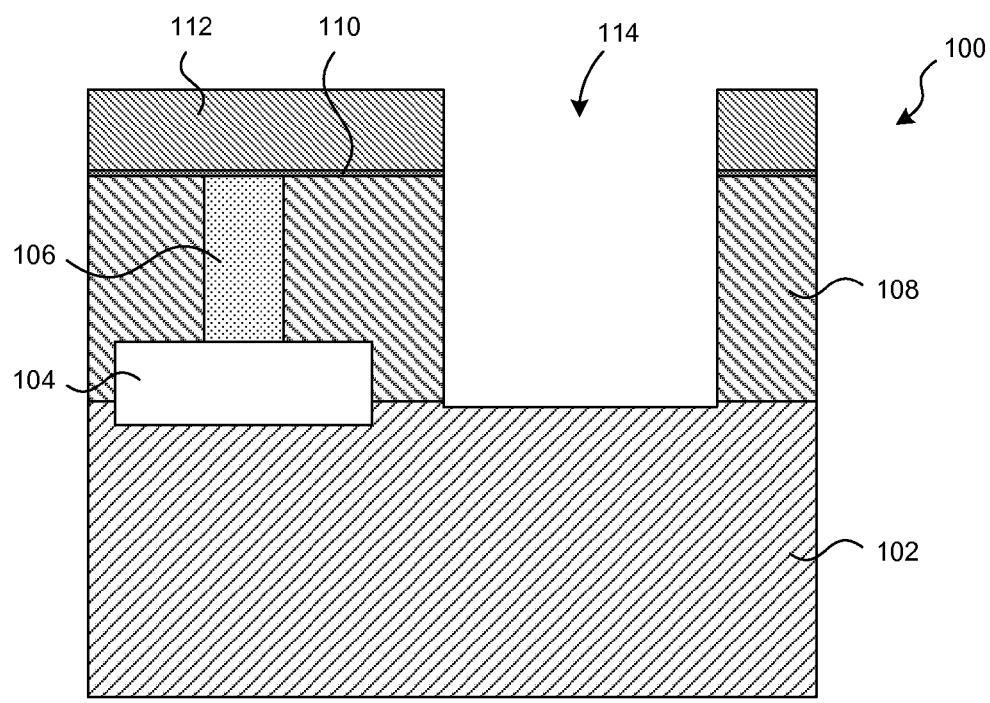
Figure 4:
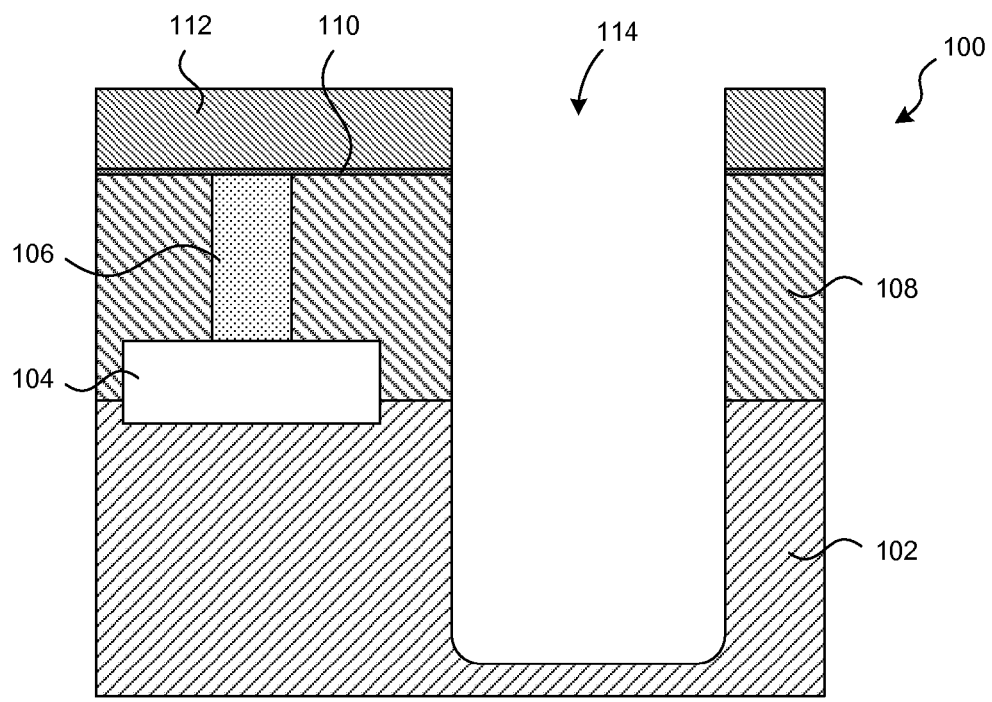
Figure 5:
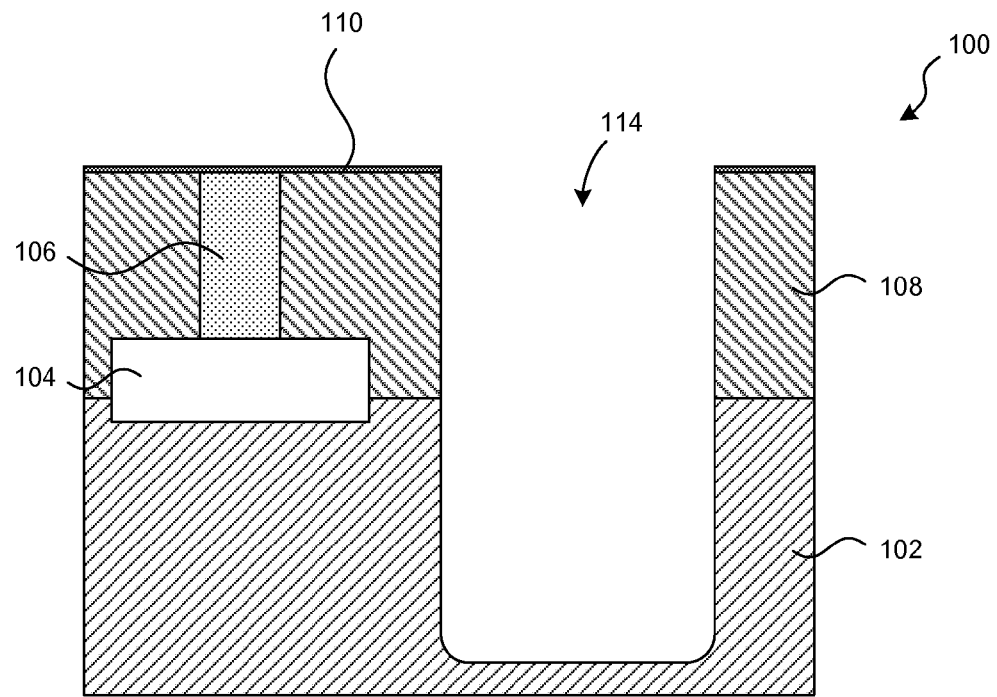

FIG. 3 shows the semiconductor device 100 after an opening 114 has been formed through the first dielectric 108. The opening 114 can be formed by depositing a photoresist 112 on the stop layer 110 and patterning the photoresist 112 using photolithography or other suitable techniques. The stop layer 110 and the first dielectric 108 can then be etched to form the opening 114. Although, for simplicity of illustration, only one opening 114 is shown in FIG. 3, the semiconductor device 100 can include a plurality of openings 114. In some embodiments, the opening 114 can be formed in more than one step. For example, FIG. 3 shows the semiconductor device 100 after a first etch forms the opening 114 through just the first dielectric 108. FIG. 4 shows the semiconductor device 100 after a second etch extends the opening 114 through a portion of the substrate 102. The first and second etches can be performed using plasma etching or other suitable techniques, and can involve different processing parameters selected for removing different materials of the first dielectric 108 and the substrate 102, respectively. In other embodiments, the opening 114 can be formed through the first dielectric 108 and the substrate 102 using a single etch. As shown in FIG. 5, after etching, the remaining photoresist 112 can be removed, e.g., using plasma ashing, wet cleans, or other suitable techniques. The opening 114 can have a sidewall extending to a depth within, but not completely through, the substrate 102 as shown in FIG. 5. Alternatively, the opening 114 can have a sidewall extending completely through the substrate 102 at this stage of the process.

Figure 6:
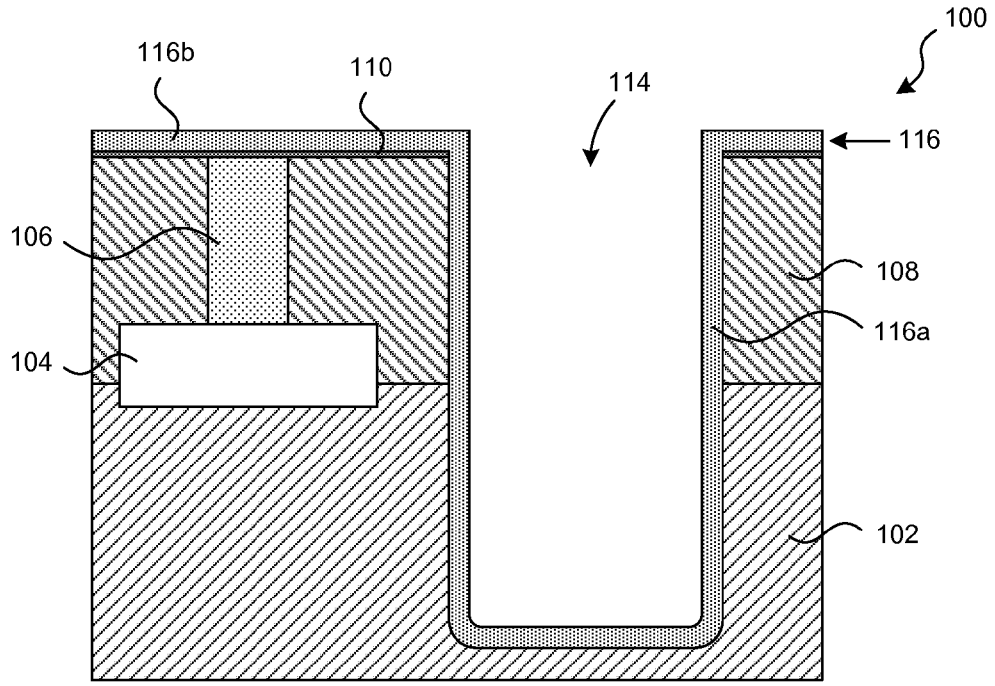

FIG. 6 shows the semiconductor device 100 including a dielectric liner 116 having a first portion 116a within the opening 114 and a second portion 116b outside the opening 114, e.g., around the opening 114. The dielectric liner 116 can define a third dielectric. The composition and/or thickness of the dielectric liner 116 can be selected to enhance the properties of the first portion 116a. For example, the dielectric liner 116 can be sufficiently thick (e.g., from about 0.05 micron to about 1.5 micron or from about 0.1 micron to about 0.4 micron) to electrically isolate a conductive structure (not shown in FIG. 6) to be formed in the opening 114 from nearby structures. Suitable materials for the dielectric liner 116 include silicon dioxide, among others. Conventional processing methodologies typically remove the second portion 116b using a chemical-mechanical removal process at the level of processing shown in FIG. 6. Although planarizing the wafer at this point can remove the second portion 116b while leaving the first portion 116a intact, this approach has various disadvantages, such as potential contamination of the conductive structure with residual slurry particles as described above.

Figure 7:
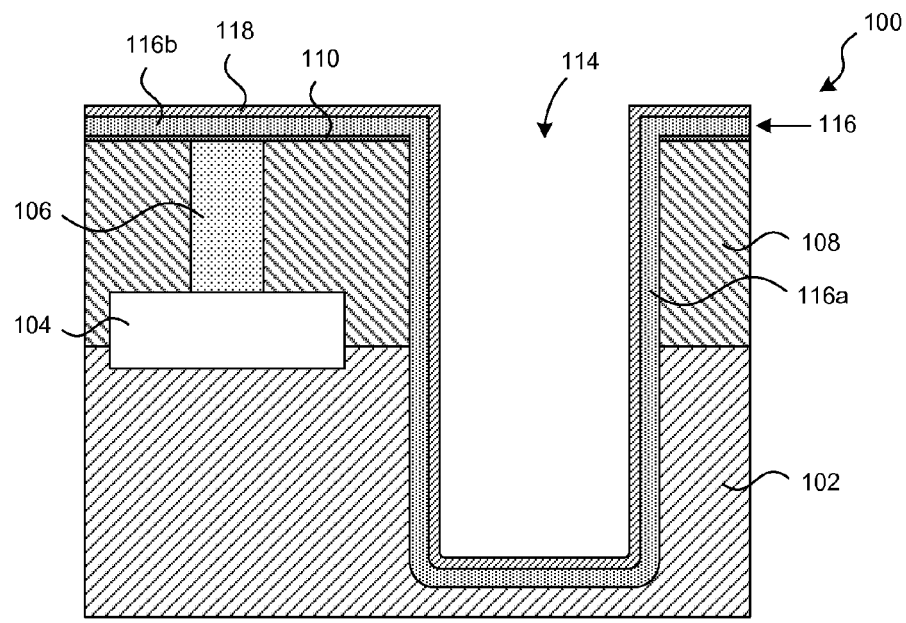

In contrast to conventional processing methodologies, several embodiments of the present technology include depositing one or more conductive materials over the dielectric liner 116 to at least partially fill the opening 114 without first planarizing the second portion 116b of the dielectric liner 116. As shown in FIG. 7, a barrier/seed structure 118 can be formed on the dielectric liner 116. The barrier/seed structure 118 can be configured to reduce diffusion of conductive material from the conductive structure (not shown in FIG. 7) to be formed in the opening 114, as well as to seed formation of the conductive structure by plating, e.g., electro- or electroless-plating. In some embodiments, the barrier/seed structure 118 can have a barrier material that does not seed formation of the conductive structure, e.g., if the conductive structure is to be formed using chemical vapor deposition rather than plating. The barrier material, for example, can include tantalum, tantalum nitride, or another suitable material. The barrier/seed structure 118 can also include a seed material defined by a layer of conductive material, e.g., copper or copper alloy. In some embodiments, the barrier/seed structure 118 can have only a single material that limits diffusion and seeds formation of a bulk conductive material. In other embodiments, the barrier/seed structure 118 can be eliminated.

Figure 8:
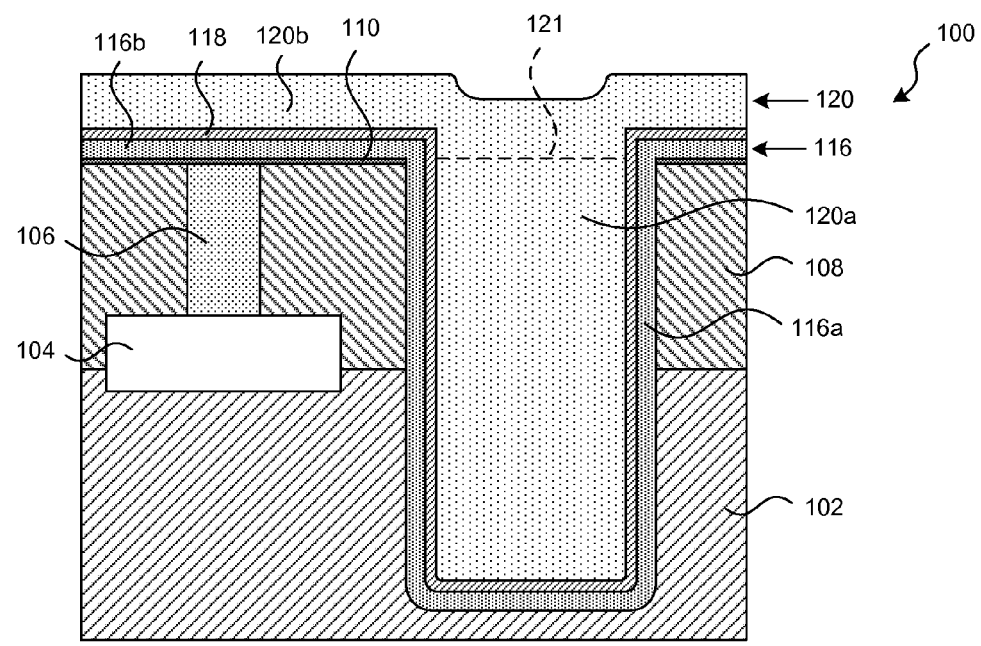

FIG. 8 shows the semiconductor device 100 after a bulk conductive material 120, e.g., a bulk metal, is formed over the barrier/seed structure 118. The bulk conductive material 120 can include a plug portion 120a within the openings 114 and excess conductive material 120b over the plug portion 120a and over areas around the openings 114, e.g., over the second portion 116b of the dielectric liner 116. For example, the excess conductive material 120b can be the portion of the bulk conductive material 120 above the conceptual elevation 121 (shown as a dashed line). In some embodiments, the bulk conductive material 120 can be a metal, e.g., copper or a copper alloy.

Figure 9:
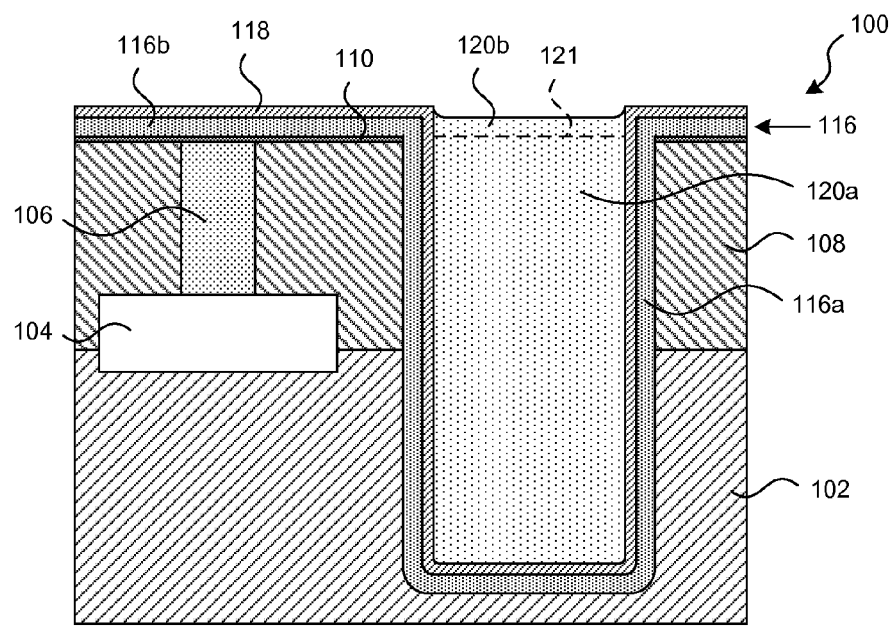
Figure 10:
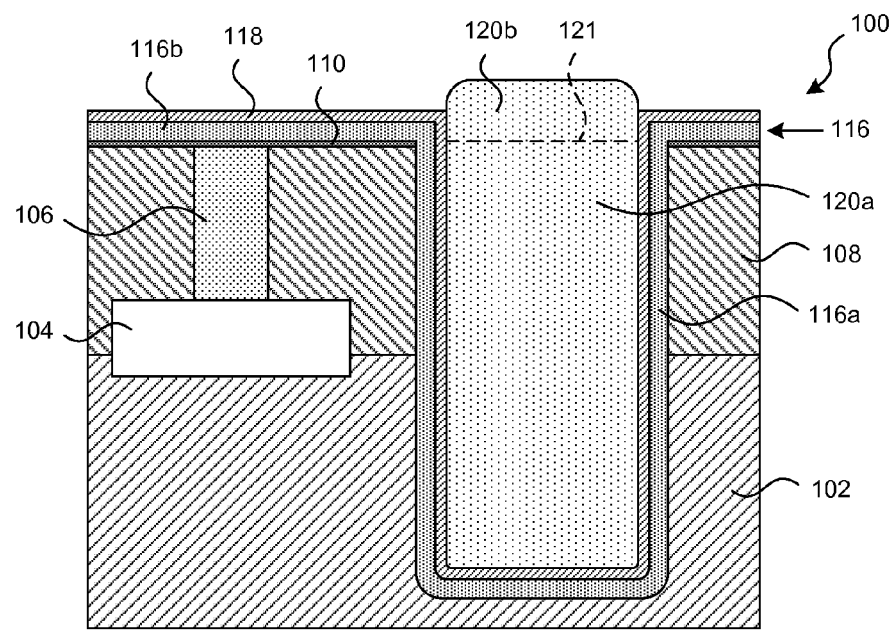

FIG. 9 shows the semiconductor device 100 after the excess conductive material 120b has been removed. For example, the semiconductor device 100 can be processed using chemical-mechanical removal with a suitable slurry. In some embodiments, when the bulk conductive material 120 includes copper, the slurry can be configured to remove copper at high rates and/or selectivities compared to other materials. The removal step can entirely remove the excess conductive material 120b, as shown in FIG. 9, or leave some of the excess conductive material 120b for removal during subsequent processing. In some cases, high removal rates of the bulk conductive material 120 using the barrier/seed structure 118 as a stop material can cause an indentation in the excess conductive material 120b above the plug portion 120a. This indentation can be eliminated during further processing. For example, as shown in FIG. 10, the plug portion 120a can be annealed after the excess conductive material 120b over the areas around the openings 114 has been removed, which can expand the plug portion 120a so that the remaining excess conductive material 120b above the plug portion 120a protrudes beyond the level of the barrier/seed structure 118. Annealing can also enhance the grain structure of the plug portion 120a and/or reduce or eliminate irregularities, e.g., gaps, at the interface between the plug portion 120a and the barrier/seed structure 118. This can enhance electron flow through the plug portion 120a during operation of the semiconductor device 100 and/or enhance the reliability of the semiconductor device 100.

Figure 11:
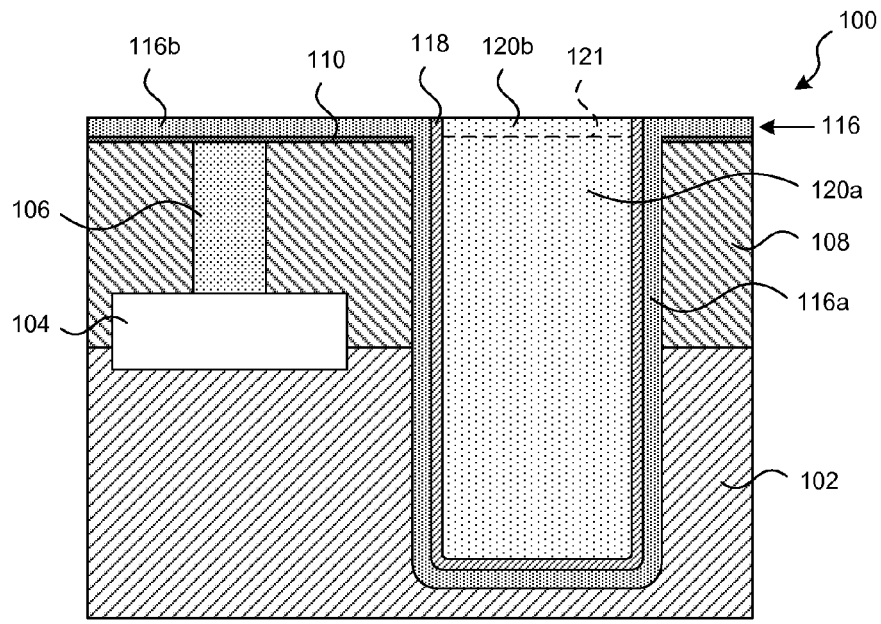
Figure 12:
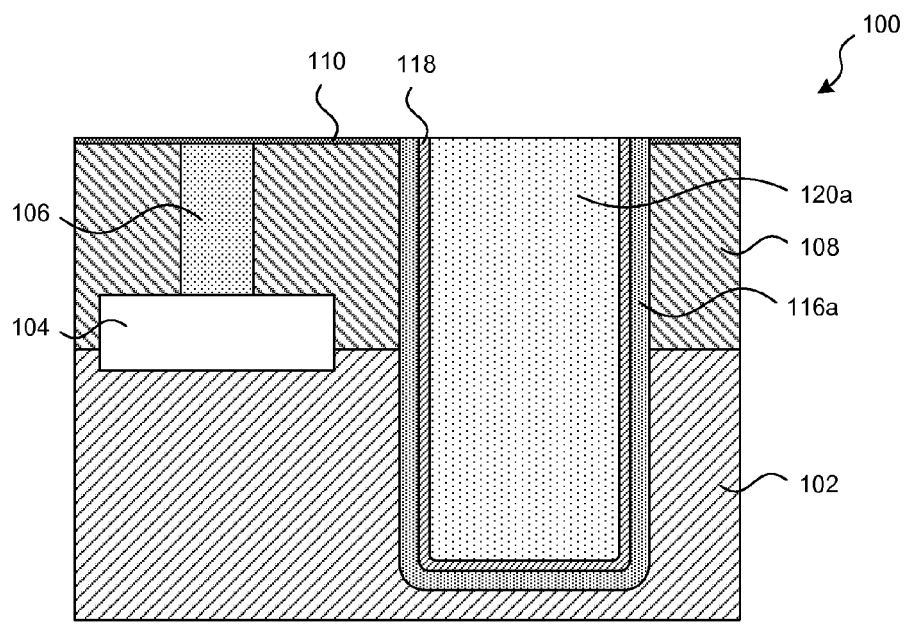

FIGS. 11-12 show the semiconductor device 100 after removal steps in accordance with an embodiment of the present technology. As shown in FIG. 11, a first removal step can include simultaneously removing the barrier/seed structure 118 outside the opening 114, e.g., in the areas around the opening 114, as well as an upper portion of the excess conductive material 120b. In some embodiments, the first removal step can further include removing part of the second portion 116b of the dielectric liner 116 after removing the barrier/seed structure 118 outside the opening 114. As shown in FIG. 12, an optional second removal step can include removing the remaining part of the second portion 116b and an additional upper portion of the excess conductive material 120b. The first and second removal steps can use different slurries, pressures, pad rotation rates, and/or other suitable parameters. In some embodiments, the first and second removal steps can be performed on the same platen, but with different slurries. In other embodiments, the first and second removal steps can be performed on different platens. Furthermore, the optional second removal step can follow the first removal step with or without an intervening cleaning step. Parameters of the first removal step can be selected to remove the barrier/seed structure 118 outside the opening 114 and, in some cases, part of the second portion 116b of the dielectric liner 116 at a relatively high removal rate (e.g., greater than about 1 micron/minute), which can enhance the efficiency of the overall manufacturing process. Parameters of the optional second removal step can be selected to allow increased control over the removal endpoint, e.g., to reduce the possibility of planarizing through the stop layer 110. The optional second removal step can be slower and/or less aggressive than the first removal step. In other embodiments, the first and second removal steps can be combined into a single removal step with generally consistent parameters or the first removal step can be slower and/or less aggressive than the optional second removal step.

The compositions of the dielectric liner 116 and the stop layer 110 can differ to enhance control over the removal (e.g., chemical-mechanical removal) endpoint. For example, the stop layer 110 can have a lower removal rate than the dielectric liner 116 such that the stop layer 110 facilitates removal of the second portion 116b of the dielectric liner 116 without planarizing the electrode 106 or the first dielectric 108. In addition to the compositions of the dielectric liner 116 and the stop layer 110, removal parameters can be selected to affect the selectivity for removing the dielectric liner 116 relative to the stop layer 110 during a removal step. Increasing the selectivity can reduce the likelihood of planarizing through the stop layer 110 to the electrode 106 or the first dielectric 108, increase the removal process window, and/or reduce the need for other manufacturing controls or testing associated with preventing and/or detecting disruption of the electrode 106 or the first dielectric 108. Increasing the thickness of the stop layer 110 can have similar benefits, but can be disadvantageous due to space constraints in the semiconductor device 100 and/or other factors. In some embodiments, the first and/or second removal steps can have selectivities (e.g., ratios of removal rates) for the dielectric liner 116, e.g., silicon dioxide, relative to the stop layer 110, e.g., silicon nitride, greater than about 5:1, e.g., greater than about 10:1, greater than about 50:1, or greater than about 100:1.

Although relatively high (e.g., greater than about 5:1) selectivity for removing the dielectric liner 116 relative to the stop layer 110 can be desirable, relatively low (e.g., between about 0.5:1 and about 1.5:1) selectivity for removing the dielectric liner 116 relative to the excess conductive material 120b can also be desirable. In some cases, without relatively low selectivity for removing the dielectric liner 116 relative to the excess conductive material 120b, undesirable topography can form on the plug portion of 120a, which can adversely affect performance and/or reliability of the semiconductor device 100. In some embodiments, the first and/or second removal steps can have selectivities for the dielectric liner 116, e.g., silicon dioxide, relative to the excess conductive material 120b, e.g., copper, between about 0.5:1 and about 1.5:1, e.g., between about 0.75:1 and about 1.25:1.

The slurry can be a parameter in the selectivity of a removal process. In some embodiments, the slurry used in the first and/or second removal steps can include an abrasive and an oxidizing agent. Examples of suitable abrasives include silicon dioxide and ceria particles, among others. Examples of suitable oxidizing agents include hydrogen peroxide and ammonium persulfate, among others. The type and/or concentration of the abrasive can predominantly affect the removal rate of the dielectric liner 116, e.g., the removal rate of the dielectric liner 116 relative to the stop layer 110. The type and/or concentration of the oxidizing agent can predominantly affect the removal rate of the excess conductive material 120b, e.g., the removal rate of the excess conductive material 120b relative to the dielectric liner 116. Accordingly, the types and/or concentrations of the abrasive and oxidizing agents can be selected together to provide relatively high selectivity for removing the dielectric liner 116 relative to the stop layer 110 and to provide relatively low selectivity for removing the dielectric liner 116 relative to the excess conductive material 120b.

Not all abrasives and oxidizing agents are compatible. Ceria particles, for example, are generally not well suited for use with some oxidizing agents, including hydrogen peroxide. For this reason, conventional slurries including ceria particles typically do not include an oxidizing agent. Ceria particles, however, can be used with certain oxidizing agents, including ammonium persulfate. Furthermore, ceria particles can allow for greater selectivity between different dielectric materials, e.g., for removing the dielectric liner 116 relative to the stop layer 110, than other abrasives, e.g., silicon dioxide particles. For example, in some cases, a slurry including ceria particles can have a selectivity for removing the dielectric liner 116 relative to the stop layer 110 between about 5 times and about 100 times greater than that of a comparable slurry including silicon dioxide particles. In some embodiments, a slurry used in the first and/or second removal steps can include ceria particles and an oxidizing agent compatible with ceria particles, e.g., ammonium persulfate. Based on the rate at which the ceria particles remove the dielectric liner 116, the concentration of the oxidizing agent can be selected to cause a similar removal rate of the excess conductive material 120b. For example, the concentrations of ceria particles and ammonium persulfate can be selected to cause a suitable selectivity for removing the dielectric liner 116 relative to the excess conductive material 120b. Suitable slurries including ceria are available, for example, from Asahi Glass Company (Tokyo, Japan), Hitachi Chemical Co., Ltd. (Tokyo, Japan), Cabot Microelectronics Corporation (Aurora, Ill.), Ferro Corporation (Mayfield Heights, Ohio), or other suitable suppliers.

In comparison to silicon dioxide particles, ceria particles typically are more expensive and less aggressive in the removal of dielectric materials. Furthermore, in some cases, ceria particles can be poorly suited for removing the barrier/seed structure 118, e.g., tantalum. The benefit of the relatively high selectivity for removing the dielectric liner 116 relative to the stop layer 110 associated with ceria particles can be realized during a limited portion of a removal step just before and after completely removing the second portion 116b of the dielectric liner 116. Accordingly, in some embodiments, ceria particles can be used in the optional second removal step, but not in the first removal step. In the first removal step, for example, silicon dioxide particles can be used with a suitable oxidizing agent, e.g., hydrogen peroxide or ammonium persulfate. In other embodiments, the first and second removal steps or a combined removal step can be performed with ceria particles. In still other embodiments, the first and second removal steps or a combined removal step can be performed with silicon dioxide particles. For example, some slurries including silicon dioxide particles can have relatively high selectivity for removing the dielectric liner 116 relative to the stop layer 110 in comparison to other slurries including silicon dioxide particles. Similar to slurries including ceria particles, the concentration of oxidizing agent in slurries including silicon dioxide particles can be selected to cause a similar removal rate of the dielectric liner 116 and the excess conductive material 120b. Suitable slurries including silicon dioxide are available, for example, from Asahi Glass Company (Tokyo, Japan), Hitachi Chemical Co., Ltd. (Tokyo, Japan), Cabot Microelectronics Corporation (Aurora, Ill.), Ferro Corporation (Mayfield Heights, Ohio), or other suitable suppliers.

Figure 13:
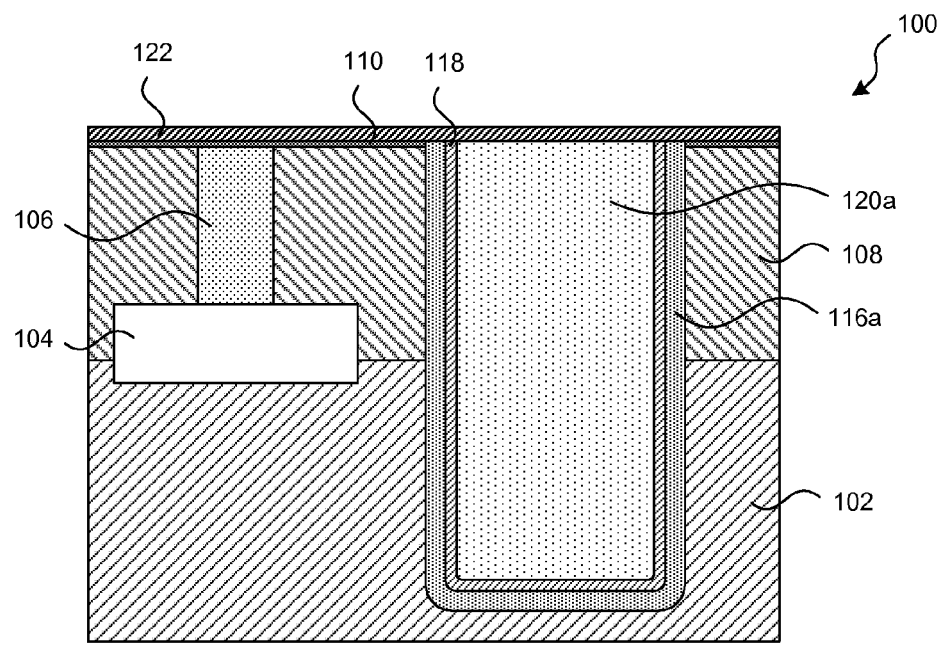
Figure 14:
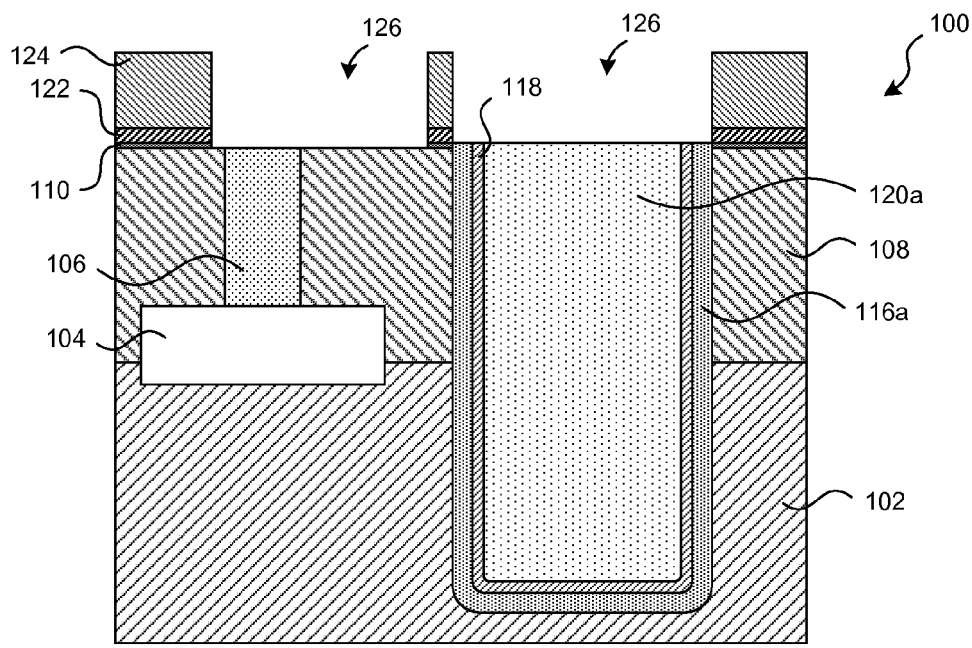
Figure 15:
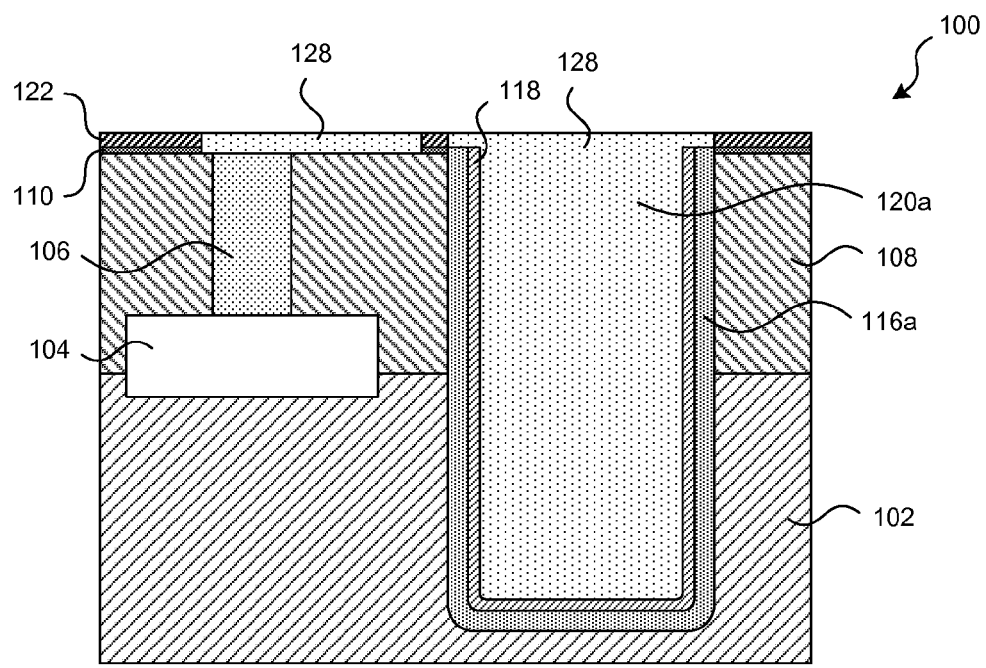

As shown in FIG. 13, after removal, a fourth dielectric 122 can be formed on the semiconductor device 100. The fourth dielectric 122 can include, for example, silicon dioxide or another suitable material. In some embodiments, the fourth dielectric 122 can be thinner than the first portion 116a of the dielectric liner 116. As shown in FIG. 14, a photoresist 124 can be deposited over the fourth dielectric 122 and patterned using photolithography or other suitable techniques. The semiconductor device 100 can then be etched to form trenches 126. As shown in FIG. 15, the trenches 126 can be filled with conductive material to form conductive lines 128 above the electrode 106 and the plug portion 120a. In some embodiments, the composition of the conductive lines 128 can be the same as the composition of the plug portion 120a. The conductive lines 128 can include, for example, copper or another suitable material.

Figure 16:
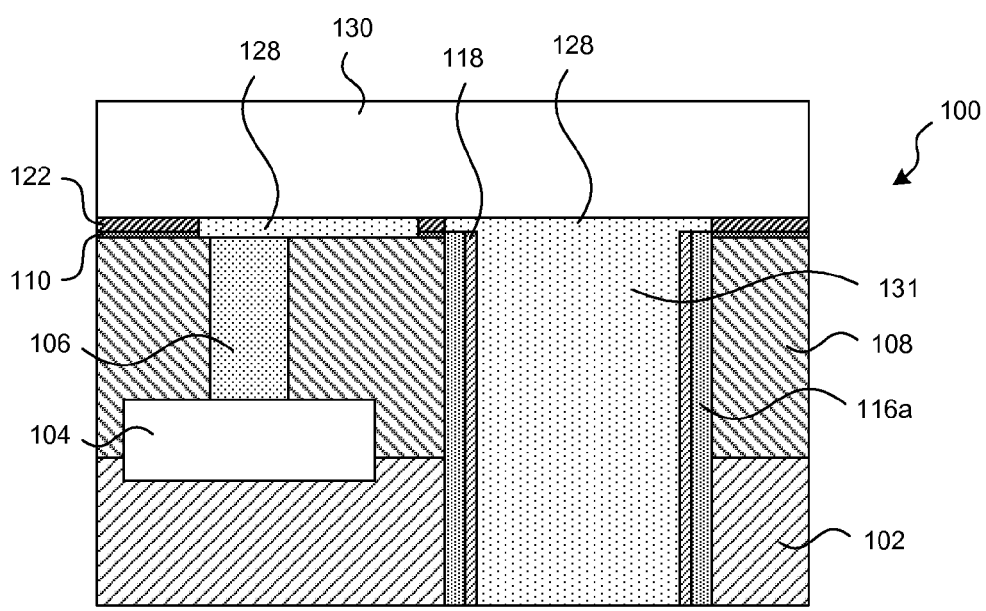
FIG. 16 is a partially schematic cross-sectional view illustrating a semiconductor device made by the method shown in FIGS. 1-15.

FIG. 16 is a partially schematic cross-sectional view illustrating the semiconductor device 100 after additional processing prior to packaging. Additional dielectric and metallization structures 130 (shown schematically) can be formed over the conductive lines 128 to complete a suitable network of electrical connections within the semiconductor device 100. As shown in FIG. 16, a lower portion of the substrate 102 can be removed by backgrinding to form a conductive plug 131 from the plug portion 120a. The semiconductor device 100 can then be incorporated alone or with other semiconductor devices into a suitable package (not shown). For example, the conductive plug 131 can be connected to leads (not shown) of the package using wire bonds (not shown), solder bumps (not shown), or other suitable structures. The semiconductor device 100 and associated structures can also be encapsulated for protection and to facilitate heat dissipation during operation.

Figure 17:
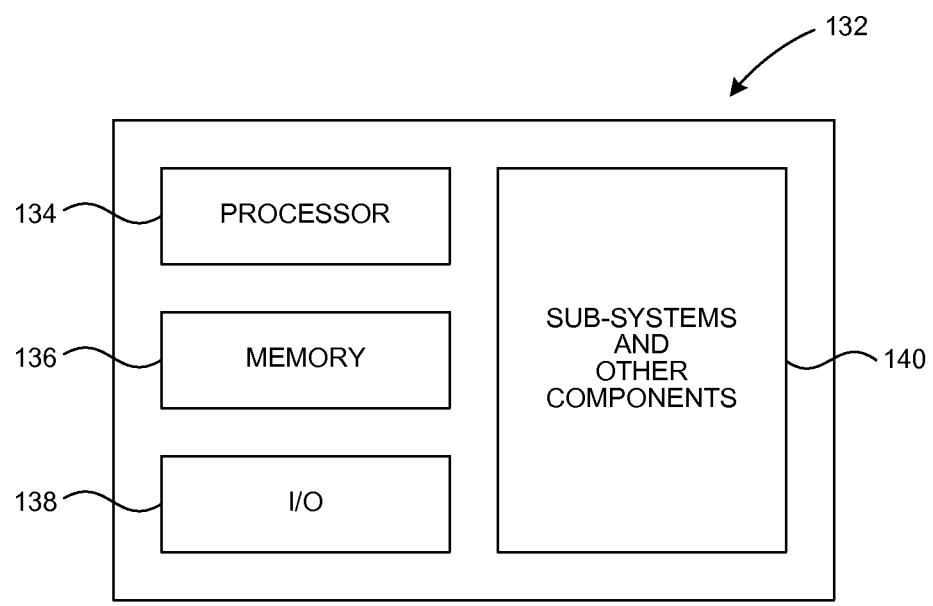
FIG. 17 is a block diagram illustrating a system that incorporates a semiconductor device in accordance with an embodiment of the present technology.

Any one of the semiconductor devices having the features described above with reference to FIGS. 1-16 can be incorporated into any of a myriad of larger and/or more complex systems, a representative example of which is system 132 shown schematically in FIG. 17. The system 132 can include a processor 134, a memory 136 (e.g., SRAM, DRAM, flash, and/or other memory devices), input/output devices 138, and/or other subsystems or components 140. The semiconductor device 100 described above with reference to FIGS. 1-16 can be included in any of the elements shown in FIG. 17. The resulting system 132 can be configured to perform any of a wide variety of suitable computing, processing, storage, sensing, imaging, and/or other functions. Accordingly, representative examples of the system 132 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 132 include lights, cameras, vehicles, etc. With regard to these and other example, the system 132 can be housed in a single unit or distributed over multiple interconnected units, e.g., through a communication network. The components of the system 132 can accordingly include local and/or remote memory storage devices and any of a wide variety of suitable computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Directional terms, such as "upper," "lower," "front," "back," "vertical," and "horizontal," may be used herein to express and clarify the relationship between various elements. It should be understood that such terms do not denote absolute orientation. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

We claim:

1. A method of manufacturing a semiconductor device, the method comprising:
    forming openings that extend through a stop material and through at least a portion of a substrate underlying the stop material;
    forming a dielectric material partially disposed within the openings and partially disposed outside the openings;
    after forming the dielectric material, forming a conductive material partially disposed within the openings and partially disposed outside the openings, wherein the dielectric material is not subjected to a removal process before forming the conductive material;
    removing a portion of the conductive material;
    after removing the portion of the conductive material, annealing a remainder of the conductive material;
    after annealing the remainder of the conductive material, simultaneously removing the dielectric material outside the openings and a portion of the remainder of the conductive material.

2. The method of claim 1, wherein simultaneously removing the dielectric material outside the openings and the portion of the remainder of the conductive material includes simultaneously removing the dielectric material outside the openings and the portion of the remainder of the conductive material by a chemical-mechanical planarization polishing process having a removal selectivity for the dielectric material relative to the stop material greater than 5:1.

3. The method of claim 1, wherein simultaneously removing the dielectric material outside the openings and the portion of the remainder of the conductive material includes exposing the dielectric material outside the openings and the portion of the remainder of the conductive material to a slurry including ceria.

4. The method of claim 1, wherein:
    removing the portion of the conductive material includes removing a first portion of the conductive material;
    simultaneously removing the dielectric material outside the openings and the portion of the remainder of the conductive material includes simultaneously removing the portion of the dielectric material and a second portion of the conductive material;
    the stop material is at a first side of the substrate;
    the substrate has a second side opposite the first side;
    the method further comprising removing a portion of the substrate and a third portion of the conductive material to expose the conductive material at the second side of the substrate; and
    the first, second, and third portions of the conductive material are different.

5. The method of claim 1, wherein:
    the stop material includes silicon nitride; and
    the dielectric material includes silicon dioxide.

6. The method of claim 1, wherein:
    the conductive material includes copper; and
    simultaneously removing the dielectric material outside the openings and the portion of the remainder of the conductive material includes simultaneously removing the dielectric material outside the openings and the portion of the remainder of the conductive material by a chemical-mechanical planarization polishing process having a removal selectivity for the dielectric material relative to the conductive material from 0.5:1 to 1.5:1.

7. The method of claim 1, wherein:
    the stop material includes a low-k material; and
    the dielectric material includes silicon dioxide.

8. The method of claim 7, wherein the low-k material is carbon-doped silicon nitride.

9. The method of claim 1, wherein simultaneously removing the dielectric material outside the openings and the portion of the remainder of the conductive material includes exposing the dielectric material outside the openings and the portion of the remainder of the conductive material to a slurry including an abrasive and an oxidizing agent at respective concentrations selected to cause a removal selectivity for the dielectric material relative to the stop material to be greater than 5:1.

10. The method of claim 9, wherein the abrasive is ceria and the oxidizing agent is ammonium persulfate.

11. The method of claim 9, wherein the abrasive is silicon dioxide and the oxidizing agent is ammonium persulfate.

12. The method of claim 9, wherein the abrasive is ceria and the oxidizing agent is ammonium persulfate.

13. The method of claim 9, wherein the abrasive is silicon dioxide and the oxidizing agent is ammonium persulfate.

14. The method of claim 1, further comprising removing a backside portion of the semiconductor device, the backside portion including a portion of the substrate and the one or more lower portions of the plug portions.

15. The method of claim 1, wherein simultaneously removing the portion of the dielectric material outside the openings and the portion of the remainder of the conductive material includes using a slurry including an abrasive and an oxidizing agent at concentrations selected to cause the selectivity.

16. A method for forming through-substrate vias in a semiconductor device, the method comprising:
    forming openings that extend through at least a portion of a substrate;
    forming a dielectric layer including liners at respective sidewalls of the respective openings and excess dielectric outside the openings adjacent to the liners;

forming a metal layer including vias within the respective openings and excess metal adjacent to the vias, wherein the dielectric layer is not subjected to a removal process before forming the metal layer;

chemically-mechanically polishing the excess metal;

after chemically-mechanically polishing the excess metal, annealing the vias;

after annealing the vias, simultaneously chemically-mechanically polishing the excess dielectric outside the openings and a remainder of the excess metal at a first side of the substrate; and removing a portion of the substrate at an opposite second side of the substrate to expose the vias at the second side of the substrate.

17. The method of claim 16, wherein removing the portion of the substrate includes backgrinding the substrate.

18. The method of claim 16, wherein:

the metal layer includes copper; and simultaneously chemically-mechanically polishing the excess dielectric outside the openings and the remainder of the excess metal includes simultaneously chemically-mechanically polishing the excess dielectric outside the openings and the remainder of the excess metal by a chemical-mechanical planarization polishing process having a removal selectivity for the excess dielectric outside the openings relative to the excess metal from 0.5:1 to 1.5:1.

19. The method of claim 16, wherein simultaneously chemically-mechanically polishing the excess dielectric outside the openings and the remainder of the excess metal includes exposing the excess dielectric outside the openings and the remainder of the excess metal to a slurry including ceria.

20. The method of claim 19, wherein the slurry further includes ammonium persulfate.

21. A method of processing a semiconductor device including a first dielectric material, comprising:

forming a second dielectric layer of the semiconductor device;

forming a third dielectric layer of the semiconductor device, the second dielectric layer being generally between the third dielectric layer and a substrate of the semiconductor device outside openings of the semiconductor device;

forming a barrier layer of the semiconductor device, the second and third dielectric layers being generally between the barrier layer and the substrate outside the openings of the semiconductor device;

forming a metal layer of the semiconductor device, the metal layer including plug portions within the openings of the semiconductor device and excess metal, wherein the third dielectric layer is not subjected to a removal process before forming the metal layer;

removing a first part of the excess metal with a first removal step;

annealing the plug portions of the metal layer after the first removal step; and after annealing the plug portions of the metal layer, chemically-mechanically processing the semiconductor device, including— simultaneously chemically-mechanically removing a second part of the excess metal and the barrier layer outside the openings until the barrier layer outside the openings is generally removed, and simultaneously chemically-mechanically removing a third part of the excess metal and the third dielectric layer outside the openings until the third dielectric layer outside the openings is generally removed.

22. The method of claim 21, wherein:

the second dielectric layer includes silicon nitride;

the third dielectric layer includes silicon dioxide;

the barrier layer includes tantalum; and the metal layer includes copper.

23. The method of claim 21, wherein:

simultaneously chemically-mechanically removing the second part of the excess metal and the barrier layer outside the openings includes exposing the second part of the excess metal and the barrier layer outside the openings to a slurry including silicon dioxide and ammonium persulfate; and simultaneously chemically-mechanically removing the third part of the excess metal and the third dielectric layer outside the openings includes exposing the third part of the excess metal and the third dielectric layer outside the openings to the slurry.

24. The method of claim 21, wherein:

simultaneously chemically-mechanically removing the second part of the excess metal and the barrier layer outside the openings includes exposing the second part of the excess metal and the barrier layer outside the openings to a first slurry including silicon dioxide; and simultaneously chemically-mechanically removing the third part of the excess metal and the third dielectric layer outside the openings includes exposing the third part of the excess metal and the third dielectric layer outside the openings to a different second slurry including ceria.

25. The method of claim 24, wherein the second slurry further includes ammonium persulfate.

26. The method of claim 24, wherein simultaneously chemically-mechanically removing the second part of the excess metal and the barrier layer outside the openings and simultaneously chemically-mechanically removing the third part of the excess metal and the third dielectric layer outside the openings occur on the same platen.

27. A method of manufacturing a semiconductor device, comprising:

forming a stop layer on the semiconductor device;

forming openings in the semiconductor device, wherein individual openings have a sidewall extending through the stop layer and through at least a portion of a substrate of the semiconductor device;

forming a dielectric liner including a first portion along the sidewalls of the openings and a second portion at areas outside the openings, wherein the stop layer is generally between the dielectric liner and the substrate at the areas outside the openings;

filling the openings with a conductive material such that the conductive material has plug portions in the openings and an excess portion wherein the second portion of the dielectric liner is not subjected to a removal process before forming the conductive material; and after filling the openings, removing a first part of the excess portion of the conductive material;

after removing the first part of the excess portion of the conductive material, annealing the conductive plugs;

after annealing the conductive plugs, simultaneously removing a second part of the excess portion of the conductive material and the second portion of the dielectric liner until the stop layer is exposed such that a remaining portion of the conductive material in the openings defines conductive plugs, wherein simultaneously removing includes selectively removing the dielectric liner relative to the stop layer at a selectivity greater than about 5:1.

\* \* \* \* \*